United States Patent
Speier et al.

(10) Patent No.: US 7,279,892 B2
(45) Date of Patent: Oct. 9, 2007

(54) CALIBRATING METHOD FOR ARTIFACT-REDUCED MRT IMAGING WHEN THERE IS FOV DISPLACEMENT

(75) Inventors: Peter Speier, Erlangen (DE); Florian Trautwein, Markgröningen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/410,630

(22) Filed: Apr. 25, 2006

(65) Prior Publication Data
US 2006/0253018 A1    Nov. 9, 2006

(30) Foreign Application Priority Data
Apr. 25, 2005    (DE)    ............ 10 2005 019 214

(51) Int. Cl.
*G01V 3/00*    (2006.01)
(52) U.S. Cl. ............................ 324/307; 324/312
(58) Field of Classification Search ............. 324/307, 324/312, 310, 309
See application file for complete search history.

(56) References Cited

U.S. PATENT DOCUMENTS

| 6,057,685 | A | 5/2000 | Zhou |
|---|---|---|---|
| 6,239,598 | B1 | 5/2001 | Zhang |
| 6,630,828 | B1 | 10/2003 | Mistretta et al. |
| 6,700,374 | B1 * | 3/2004 | Wu et al. ............... 324/312 |
| 7,064,547 | B1 * | 6/2006 | King et al. ............ 324/309 |
| 7,132,826 | B1 * | 11/2006 | Jung et al. ........... 324/307 |

OTHER PUBLICATIONS

Edward Brian Welch, Joel P. Felmlee, Richard L. Ehman, and Armando Manduca, "Motion Correction Using the *k*-Space Phase Difference of Orthogonal Acquisitions", Magnetic Resonance in Medicine, 2002, pp. 147-156, vol. 48, Wiley-Liss, Inc.

Ajit Shankaranarayanan, Michael Wendt, Jonathan S. Lewin, and Jeffrey L. Duerk, "Two-Step Navigatorless Correction Algorithm for Radial *k*-Space MRI Acquisitions", Magnetic Resonance in Medicine, 2001, pp. 277-288, vol. 45, Wiley-Liss, Inc.

* cited by examiner

*Primary Examiner*—Louis M. Arana (57) ABSTRACT

The present invention relates generally to nuclear magnetic resonance tomography (synonym: magnetic resonance tomography—MRT) as used in medical applications for examining patients; it relates in particular to a calibrating method when there is FOV displacement within a plane through angle-dependent modulating of the phase of the Fourier DC point of the respective read-out direction in MRT imaging for determining the device-specific dependency of the time delay requiring to be compensated between the reference signal effecting modulation and the read-out measuring data points of the respective read-out direction of settable measurement parameters.

9 Claims, 9 Drawing Sheets

Radial scanning (projection data set) with 10 projections

FIG 2B

Projection data set with 36 projections

33 scanning values per projection

FIG 3A

Phantom image in the case of Cartesian scanning

FIG 3B

Phantom image in the case of
radial scanning without correction
(artifacts)

FIG 8 without correction
560 Hz/pixel with correction
560 Hz/pixel

200 Hz/pixel

1500 Hz/pixel

FIG 9

CALIBRATING METHOD FOR ARTIFACT-REDUCED MRT IMAGING WHEN THERE IS FOV DISPLACEMENT

CROSS REFERENCE TO RELATED APPLICATIONS

This application claims priority of German application No. 102005019214.9 filed Apr. 25, 2005, which is incorporated by reference herein in its entirety.

FIELD OF THE INVENTION

The present invention relates generally to nuclear magnetic resonance tomography (synonym: magnetic resonance tomography—MRT) as used in medical applications for examining patients; it relates in particular to a calibrating method enabling artifact-reduced MRT imaging when there is FOV displacement.

BACKGROUND OF THE INVENTION

MRT is based on the physical phenomenon of nuclear magnetic resonance and has been successfully used as an imaging method in medical and biophysical applications for over 15 years. It is a technique whereby the examinee is exposed to a strong, constant magnetic field, as a result of which the nuclear spins of the atoms in the examinee that were previously randomly oriented become regularly oriented. High-frequency waves can then excite these "regularized" nuclear spins to oscillate in a specific manner. This oscillating produces the actual measuring signal in the MRT, which signal is recorded by means of suitable receiving coils. The use of inhomogeneous magnetic fields, produced by gradient coils, enables the object being measured to be spatially coded in all three directions in space. The method allows free selection of the layer requiring to be imaged, as a result of which cross-sectional images of the human body can be taken in all directions. MRT as a cross-sectional imaging technique used in medical diagnostics is distinguished primarily, as a "non-invasive" examination method, by its versatile contrasting capabilities. As it enables an excellent display of soft tissue, MRT has developed into a method in many respects superior to x-ray computer tomography (CT). MRT is today based on the use of spin-echo and gradient-echo sequences permitting excellent image quality with measuring times in the order of a few seconds to minutes (depending on the specific application).

Constant technical further development of the components employed in MRT devices and the introduction of fast imaging sequences have enabled MRT to be used in an increasing number of medical applications. Real-time imaging to support minimally invasive surgery, functional imaging in neurology, and perfusion measuring in cardiology are just a very few examples.

SUMMARY OF THE INVENTION

Data is recorded in MRT in what is termed the k space (synonym: frequency space), with what is termed the k-space trajectory determining scanning, which is to say the sequence of data recording in the k space. The MRT image in what is termed the image space is linked using Fourier transformation to the MRT data in the k space. Although there are several ways for performing the object's location coding spanning the k space, Cartesian or radial (projection-by-projection) scanning is the most usual method. Coding is performed using gradients in all three directions in space. With Cartesian scanning a distinction is made between layer selection (specifies a recording layer in the object, for example the z-axis), frequency coding (specifies a direction in the layer, for example the x-axis), and phase coding (determines the second dimension within the layer, for example the y-axis). Depending on how the three gradients are combined or, as the case may be, connected in what is termed an imaging sequence, the k space can be scanned in a Cartesian manner (which is to say line by line) or radially or, as the case may be, spirally.

To survey a layer in the object being examined in a Cartesian manner, an imaging sequence is repeated N times for different values of the phase-coding gradient, for example $G^y$, with the frequency of the nuclear-resonance signal being scanned during each sequence pass N times by a $\Delta t$-clocked ADC (analog-to-digital converter) in equidistant time steps $\Delta t$ in the presence of the read-out gradient $G^x$, then digitized and stored. A number matrix (matrix in the k space or, as the case may be, k matrix) is thereby obtained that has been produced line by line and has N×N data points (a symmetrical matrix with N×N points is only one example; asymmetrical matrices can also be produced). An MR image of the observed layer having a resolution of N×N pixels can be directly reconstructed from this data set by means of a Fourier transformation.

The k space can equally be surveyed using radial scanning (projection-reconstruction method), which is to say the k matrix can be scanned radially. A radial scanning trajectory in the k space consists of sections of what are termed adjacent straight lines of projection $\phi_i$ through the k space's origin which among themselves have an azimuthal angle $\Delta\phi_i$. Each section corresponds to the Fourier-transformed (parallel) projection of the object being imaged under the angle $\Delta\phi+\pi/2$.

The projection itself exists only in the image space and comprises the totality of all line integrals through the object being imaged along the specified projection direction. In the k space a straight line (the straight line of projection just mentioned) which passes through its center and stands orthogonally on the projection direction corresponds to said projection in the image space. The straight line of projection is initially non-oriented, having in mathematical terms no preferred orientation. The functional values on said straight line are obtained, as in the case of Cartesian scanning, through Fourier transformation of the projection values.

So that the k-space values associated with a projection can be determined during the application of MRT methods, the non-oriented straight line of projection must be temporally traversed and scanned, which is achieved by appropriately moving the MRT device. The straight line of projection is thus given an orientation as a result of the measuring process. This now oriented straight line (indicated in the Figures by means of arrows) is referred to as an oriented straight line of projection.

Figure 2A:
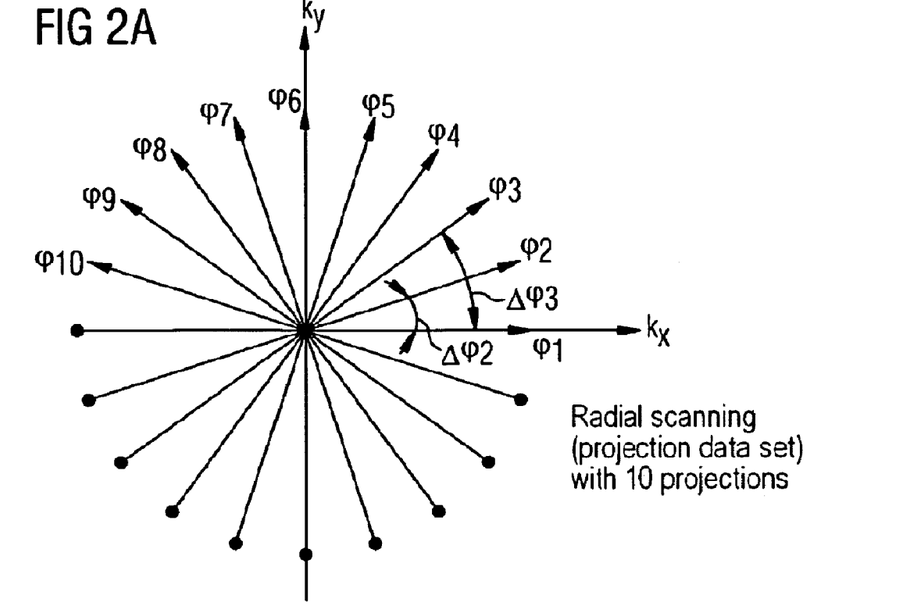
FIG. 2A shows the projection data set of radial scanning with 10 projections.
Figure 2B:
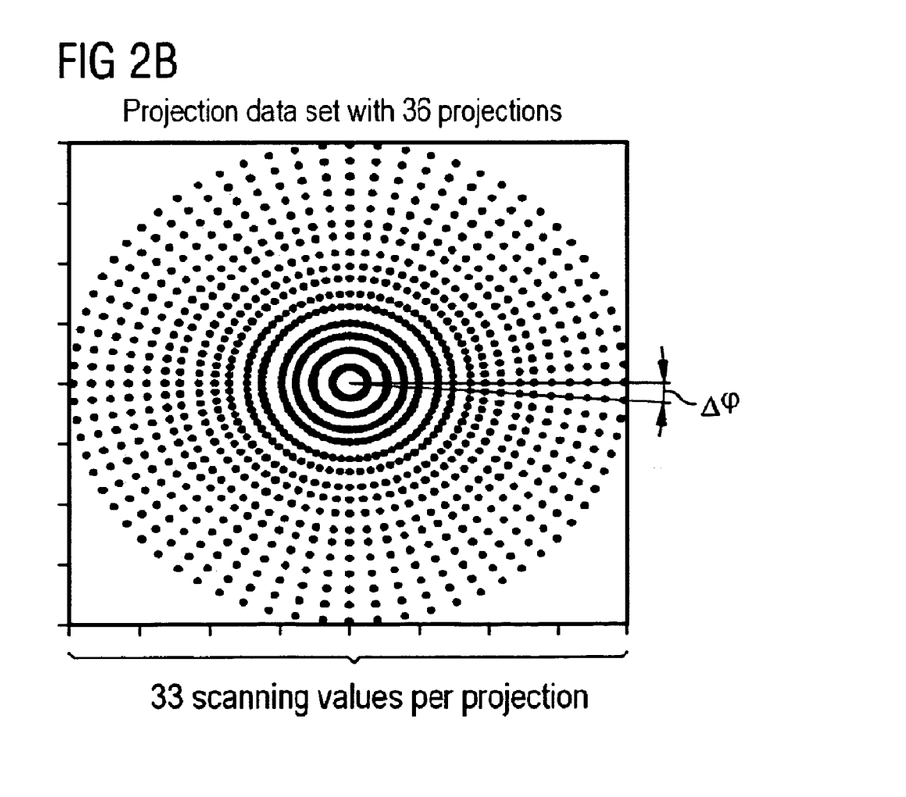
FIG. 2B shows the individual k-space measuring points of a projection data set with 36 projections and 33 scanning values per projection.

The data pertaining to a straight line of projection, which is to say to a single k-space line, is frequency-coded by means of a gradient when read out. In one acquisition method for projection reconstructions a gradient G is employed that does not scan parallel lines in the Cartesian format but rotates them around the object being examined (usually by appropriately linking the frequency-coding gradient $G^x$ and phase-coding gradient $G^y$). The relevant projection is thus obtained from a specific direction at each measuring step, right through the entire object being examined; a typical data set is hence obtained for the projection reconstruction in the k space, as shown in FIGS. 2A and 2B.

Each projection $\phi_i$ in the k space has an azimuthal angular spacing $\Delta\phi_i$ from its neighbor, which spacing is produced by turning the direction of the frequency-coding gradient. The individual k-space measuring points are shown in FIG. 2B.

Radial k-space scanning (radial MRT imaging) is becoming increasingly more significant compared to Cartesian scanning, particularly where interventional MRT imaging is concerned:

In contrast to Cartesian scanning, radial scanning of the frequency space—especially in the imaging of moving objects such as a beating heart—is advantageous because motion artifacts will be smudged across the entire image field during image reconstruction and hence rendered inconspicuous.

Each projection, which is to say each read-out direction, likewise receives data of the FOV, in particular from the center thereof, with a scanning density proportional to $$\frac{1}{r},$$

where r is the distance from the k-matrix center (center of the projection data set, Fourier DC point). The high scanning density in the FOV center will thus also allow very underscanned images to be interpreted.

The FOV (Field Of View) is the area in which signals (k-space data) can be uniquely assigned to one position. If the object being examined is situated within the FOV, with Cartesian scanning all object positions are clearly determined via the phase modulation of a plurality of phase-coding steps. Ambiguities will result if said object is situated partially outside the FOV. This is shown in the Figure by folds, also called fold-over artifacts. With radial MRT imaging there will be no high-intensity folding from the FOV's outer area if the object being examined extends beyond the FOV, as is the case with Cartesian scanning particularly in the phase-coding direction. There will merely be an irregular increase in the background signal, resulting overall in a slight reduction in image contrast. This allows FOVs to be viewed that are far smaller than the object being examined.

A disadvantage of radial MRT imaging is the complexity of image reconstruction associated therewith, the projection data set obtained having to be re-projected onto a Cartesian grid, a process known as regridding. This very compute-intensive process can, however, take place even in real time through the use of more powerful modern computers.

A further drawback of radial scanning, affecting the k-space trajectory, is that it requires a higher degree of scanning accuracy than the Cartesian method. However, varying departures from the ideal star-shaped structure having azimuthally equidistant projections can now be detected using suitable calibration measurements and taken into consideration during image reconstruction. The scanning accuracy mentioned of the k-space trajectory depends both on the geometry of the beamed-in HF exciting pulses or, as the case may be, of the gradient pulses applied in all three directions in space and on the timing of the gradient pulses and data acquisition (data read-out, signal read-out) by the ADC.

Figure 3A:
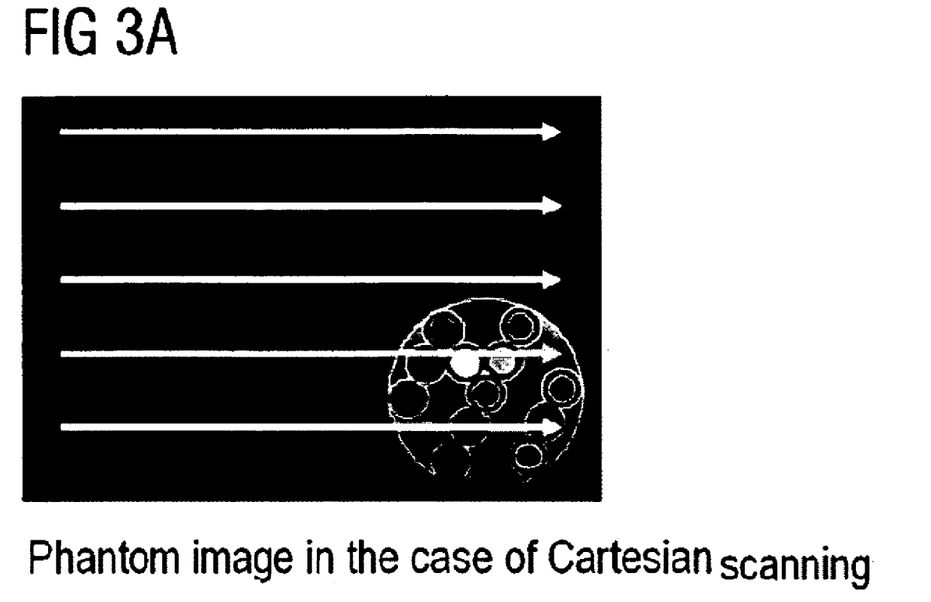
FIG. 3A shows an inplane-displaced phantom image in the case of Cartesian k-space scanning.
Figure 3B:
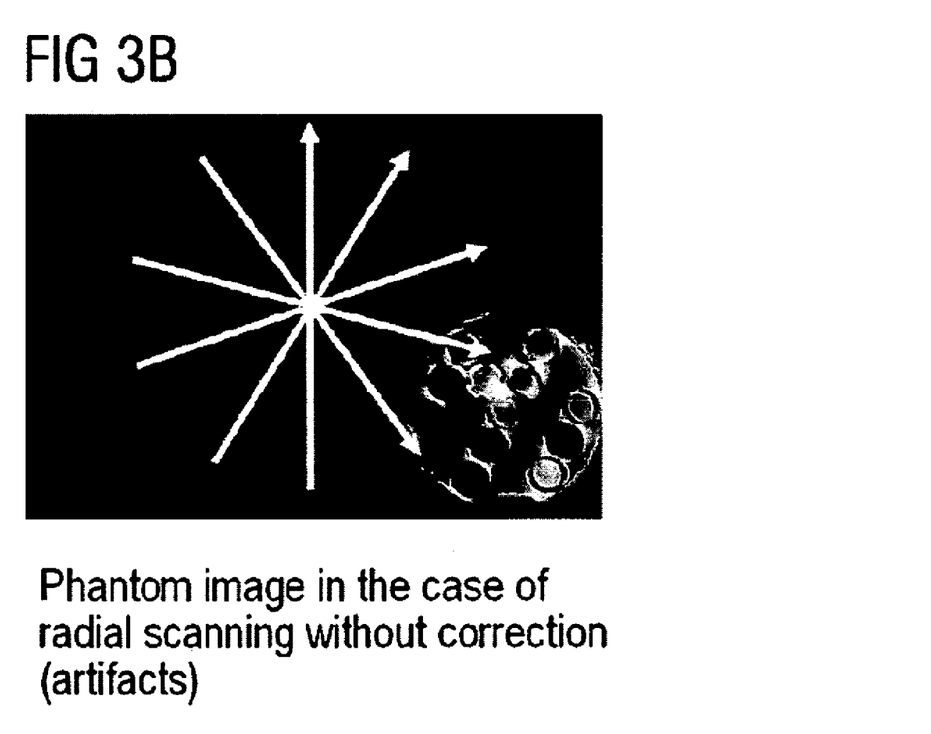
FIG. 3B shows the same inplane-displaced phantom image in the case of radial k-space scanning.

Radial scanning also places more stringent demands on the measuring apparatus than Cartesian scanning in the case of measurements with FOV displacement in the imaging plane (referred to as inplane displacement) relative to the gradient system's isocenter. Measurements of said type, for example cardiac recordings, require the FOV to be positioned onto the relevant partial area of the object that is of interest (the heart, for instance), which, in contrast to Cartesian recordings, inevitably results in extreme image artifacts in the case of radial scanning due to hardware imperfections. Examples of this are shown in FIGS. 3A and 3B. FIG. 3A shows a correct phantom image displaced in the FOV plane in the case of Cartesian scanning, while in FIG. 3B the likewise displaced phantom image displays extreme image artifacts when the k spaces have been radially scanned.

The object of the present invention is to provide a calibrating method, a measuring method, and a correction method which together enable artifact-reduced MRT imaging when an FOV is displaced in a plane.

Said object is inventively achieved by means of the features of the independent Claims. The dependent Claims further develop the idea central to the invention in a particularly advantageous manner.

Inventively claimed is a calibrating method applied to FOV displacement ($\Delta S$) within a plane due to angle-dependent modulating of the phase (PH) of the signal in the Fourier DC point of the respective read-out direction ($\phi_i$) in MRT imaging for determining the device-specific dependency of the time delay (dt) to be compensated between the reference signal effecting the modulation and the read-out measuring data points of the respective read-out direction ($\phi_i$) of settable measurement parameters, having the following steps:

Specifying a read-out direction ($\phi_i$)

Measuring at least two phase values (PH) in the Fourier DC point with different but identically oriented displacement of the FOV in said read-out direction ($\phi_i$)

Determining the time delay (dt) in the form of the slope of a linear function formed by the at least two phase values Repeating the measuring and determining steps if there is a variation in at least one measurement parameter requiring to be set until a mathematical correlation can be determined between the time delay (dt) and respective measurement parameter.

In a possible embodiment of the invention the measurement parameter therein characterizes the scanning rate t of radial k-space scanning.

The mathematical correlation can be presented in the form, for example, $dt = A \cdot t + B$, where t is indirectly proportional to the product of bandwidth and resolution.

Measuring of the phase (PH) in the Fourier DC point after displacement is advantageously based on averaging of the complex values of all points of the specifically Fourier-transformed among the measuring points of the respective read-out direction ($\phi_i$).

It is further advantageous to weight the Fourier-transformed measuring points in the read-out direction ($\phi_i$) with their magnitude square during averaging.

Measuring is therein performed on a homogeneously signal-transmitting phantom contained completely within the FOV.

Further claimed is a measuring method for artifact-reduced MRT imaging with FOV displacement on the basis of a preceding calibrating method according to the claims, having the steps:

Generating high-frequency exciting pulses

Radial projection-by-projection scanning of response signals in the k space by suitably switched gradient pulses using an analog-to-digital converter (ADC) in such a manner that the respective ADC scanning of a read-out direction ($\phi_i$) is superimposed by a specific harmonic reference signal whose frequency ($\omega_i$) is dependent on the respective read-out direction ($\phi_i$), wherein the phase of the reference signals relative to ADC scanning is selected based on the result of the preceding calibrating methods in such a way that the phase (PH) in the Fourier DC point of the respective read-out direction ($\phi_i$) is independent of the frequency ($\omega_i$) of the reference signal, Performing a Fourier transformation on the thus obtained radial projection data set in order to obtain an artifact-reduced image in the local space.

Further inventively claimed is a correction method for artifact-reduced MRT imaging with FOV displacement on the basis of a preceding calibrating method according to the claims, having the steps:

Generating high-frequency exciting pulses

Radial projection-by-projection scanning of response signals in the k space by suitably switched gradient pulses using an analog-to-digital converter (ADC) in such a manner that the respective ADC scanning of a read-out direction ($\phi_i$) is superimposed by a specific harmonic reference signal whose frequency ($\omega_i$) is dependent on the respective read-out direction ($\phi_i$), Determining the projection-specific error phase $d\phi_i$ due to a time delay (dt) between the ADC signal and reference signal on the basis of the preceding calibrating method, Projection-by-projection correcting of the phase of the acquired radial data set by multiplying the data points of the respective projection ($\phi_i$) by a phase-correction factor $\exp(-i\, d\phi_i)$, Performing a Fourier transformation on the thus obtained phase-corrected radial data set in order to obtain an artifact-reduced image in the local space.

Further inventively claimed is a device suitable for implementing the method according to the claims.

Claimed in addition is a computer software product which implements a method according to above claims when running on a computing device connected to a nuclear magnetic resonance tomography device.

BRIEF DESCRIPTION OF THE DRAWINGS

Further advantages, features, and characteristics of the present invention are explained in more detail below with the aid of exemplary embodiments and with reference to the accompanying drawings.

DETAILED DESCRIPTION OF THE INVENTION

The inventive method will be explained using radial MRT imaging as an example because the error occurring therein that has to be corrected appears in its most extreme form. The inventive method can be extended to other measuring methods such as spiral imaging, PROPELLERS, as well as to certain Cartesian methods. The latter, for example, in the case of navigated sequences where the layer follows the moving organ during recording if the organ's motion is in the read-out direction. The same applies if the table on which the patient is lying is continuously moved during scanning (MDS: Move During Scan) and the read-out direction corresponds to the direction of motion.

Figure 1:
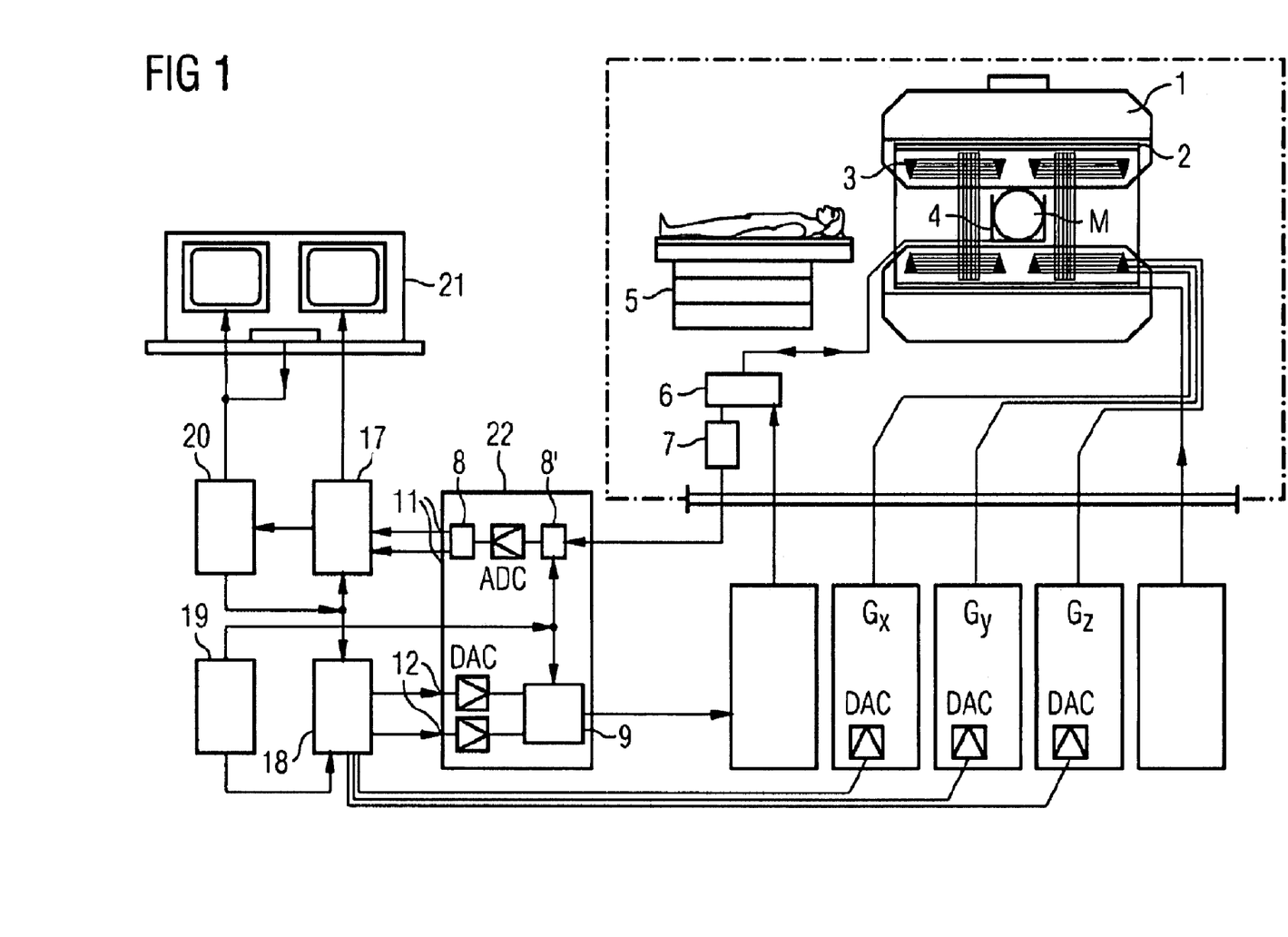
FIG. 1 is a schematic of a nuclear magnetic resonance tomography device according to the present invention.

FIG. 1 is a schematic of a magnetic resonance imaging device or, as the case may be, nuclear magnetic resonance tomography device for producing artifact-free MRT images of a partial area of an object with displacement of the FOV in a plane (referred to as inplane displacement) according to the present invention. The structure of the nuclear magnetic resonance tomography device therein corresponds to that of a conventional tomography device. A basic field magnet 1 generates a strong magnetic field that is constant in time for polarizing or, as the case may be, orienting the nuclear spins in an area of an object being examined such as, for example, a part of a human body under examination. The high degree of homogeneity to be exhibited by the basic-magnet field for the purpose of nuclear magnetic resonance measuring is defined in a typically spherical measuring volume M into which the parts of the human body being examined are brought. What are termed shim plates made of ferromagnetic material are attached at a suitable location to support the homogeneity requirements and in particular to eliminate temporally invariable influences. Temporally invariable influences are eliminated by shim coils 2 driven by a shim power supply 15.

A cylindrical gradient coil system 3 consisting of three partial windings is used in the basic field magnets 1. Each partial winding is supplied by an amplifier with current for producing a linear gradient field in the respective direction of the Cartesian coordinate system, with the first partial winding of the gradient field system 3 producing a gradient $G_x$ in the x direction, the second partial winding producing a gradient $G_y$ in the y direction, and the third partial winding producing a gradient $G_z$ in the z direction. Each amplifier includes a digital-to-analog converter driven by a sequence controller 18 for generating gradient pulses at the correct time.

Within the gradient field system 3 is a high-frequency antenna 4 which converts the high-frequency pulses supplied by a high-frequency power amplifier into a magnetic pulsating field for exciting the nuclei and orienting the nuclear spins of the object or, as the case may be, area of the object being examined. The high-frequency antenna 4 consists of one or more HF transmitting coils and a plurality of HF receiving coils in the form of an annular, preferably linear or matrix-shaped arrangement of component coils. The pulsating field emanating from the precessing nuclear spins, which is to say, as a rule, the nuclear spin echo signals produced by a pulse sequence comprising one or more high-frequency pulses and one or more gradient pulses, is also converted by the HF receiving coils of the high-frequency antenna 4 into a voltage which is routed to a high-frequency receiving channel 8 of a high-frequency system 22 via an amplifier 7. Said high-frequency system 22 further includes a transmitting channel 9 in which the high-frequency pulses for exciting the magnetic nuclear resonance are produced, with the respective high-frequency pulses being represented digitally in the sequence controller 18 as a series of complex numbers on the basis of a pulse sequence specified by the system computer 20. This series of numbers is routed as a real and imaginary component via in each case one input 12 to a digital-to-analog converter in the high-frequency system 22 and by this to a transmitting channel 9. The pulse sequences are modulated in said transmitting channel 9 onto a high-frequency carrier signal whose base frequency corresponds to the resonance frequency of the nuclear spins in the measuring volume.

Switchover from transmit to receive mode is effected by means of a duplexer 6. The HF transmitting coil of the high-frequency antenna 4 beams the high-frequency pulses for exciting the nuclear spins into the measuring volume MV and scans resulting echo signals via the HF receiving coils. The thus obtained nuclear resonance signals are phase-sensitively demodulated in the receiving channel 8' (first demodulator) of the high-frequency system 22 onto an intermediate frequency and digitized in the analog-to-digital converter (ADC). This signal must be demodulated at the frequency 0. Demodulating at the frequency 0 and separation into a real and imaginary component takes place in a second demodulator 8 after digitizing in the digital domain. An image is reconstructed by an image computer 17 from the measuring data obtained in this way. The measuring data, image data, and control programs are administered via the system computer 20. The sequence controller 18 controls generating of the respectively required pulse sequences and corresponding scanning of the k space on the basis of a specification using control programs, with said sequence controller 18 in particular controlling the correctly timed switching of the gradients, transmission of the high-frequency pulses with a defined phase and amplitude, and reception of the nuclear resonance signals. The time base for the high-frequency system 22 and sequence controller 18 is made available by a synthesizer 19. A terminal 21 containing a keyboard and one or more monitors is used to select the relevant control programs for producing a nuclear magnetic resonance image and for displaying the nuclear magnetic resonance image that has been produced.

Figure 4:
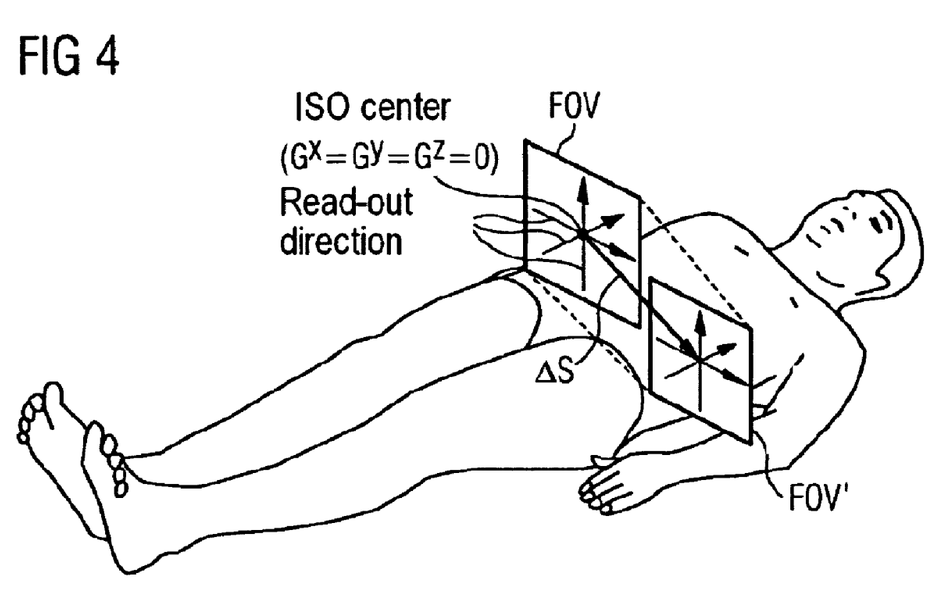
FIG. 4 shows the FOV's inplane displacement relative to the patient.

As already mentioned in the introduction to this description, it may be necessary to displace the FOV within a plane (referred to as inplane displacement) during the course of radial k-space scanning. A displacement $\Delta S$ of said type is shown in FIG. 4. The starting point is an FOV whose center corresponds to the isocenter of the gradient system (in which all gradient values are zero: $G^x = G^y = G^z = 0$) and in which all read-out directions (projections) of radial scanning mutually cross over. This FOV must now be displaced within the FOV plane by an extent $\Delta S$ (inplane displacement) so that the then displaced FOV is positioned, in the case of FIG. 4 for example, onto the patient's heart. Inplane displacing of the FOV by $\Delta S$ into the local space is realized in the case of radial scanning, which as such defines a projection data set (according to FIGS. 2A or 2B, for example), by modulating (multiplying) the measured values of a projection $\phi_i$ (read-out direction i) of said projection data set with (by) a harmonic (oscillating) reference signal $e^{i\omega_i t}$. The frequency $\omega_i$ of said reference signal is oriented on the azimuthal angle $\Delta\phi_i$ of the respective projection $\phi_i$ relative to a defined k-space projection and so is different for each read-out direction $\phi_i$. ("Projection" and "read-out direction" are equivalent terms).

Figure 9:
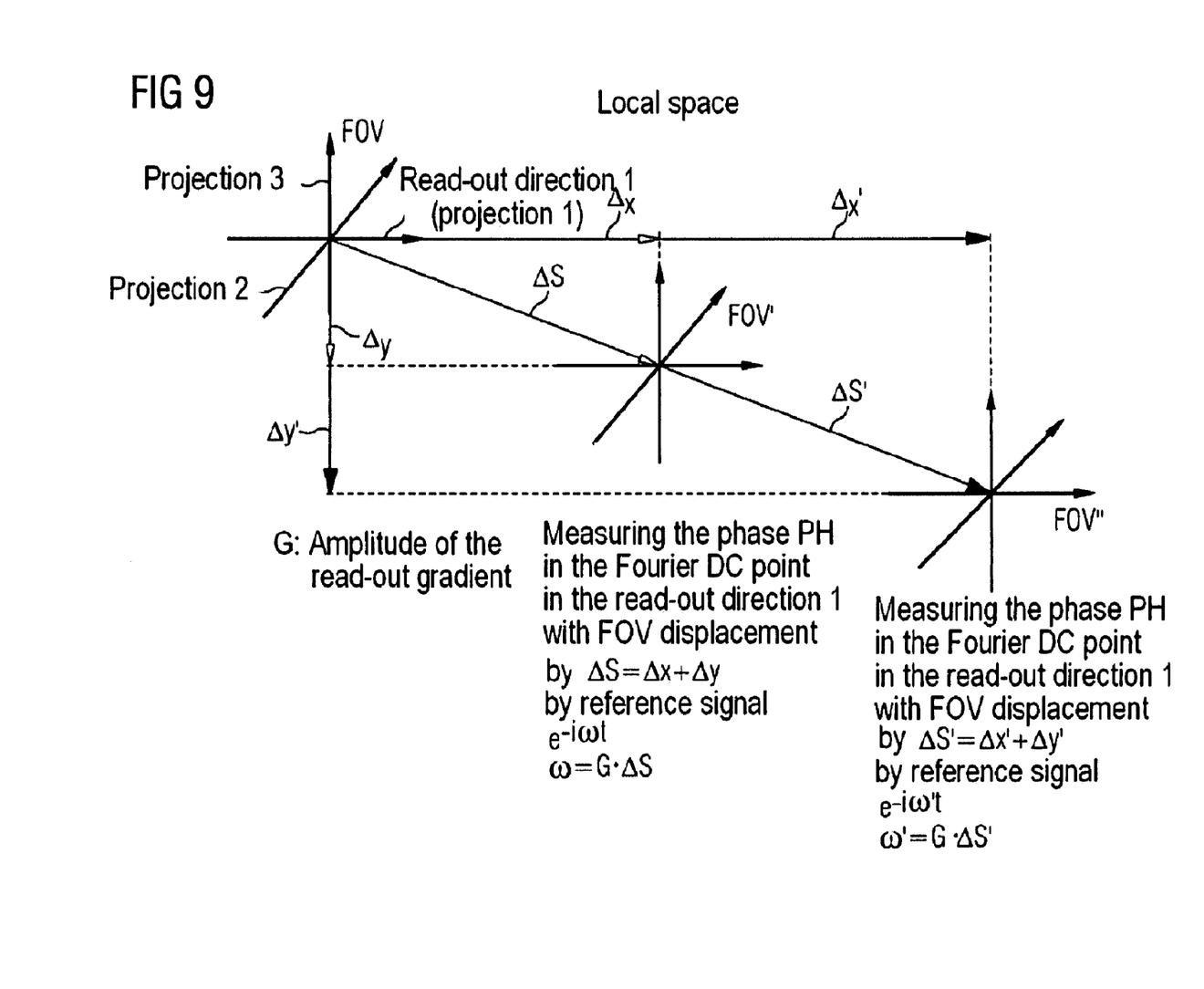
FIG. 9 shows the FOV's inplane displacement in the local space.
Figure 10:
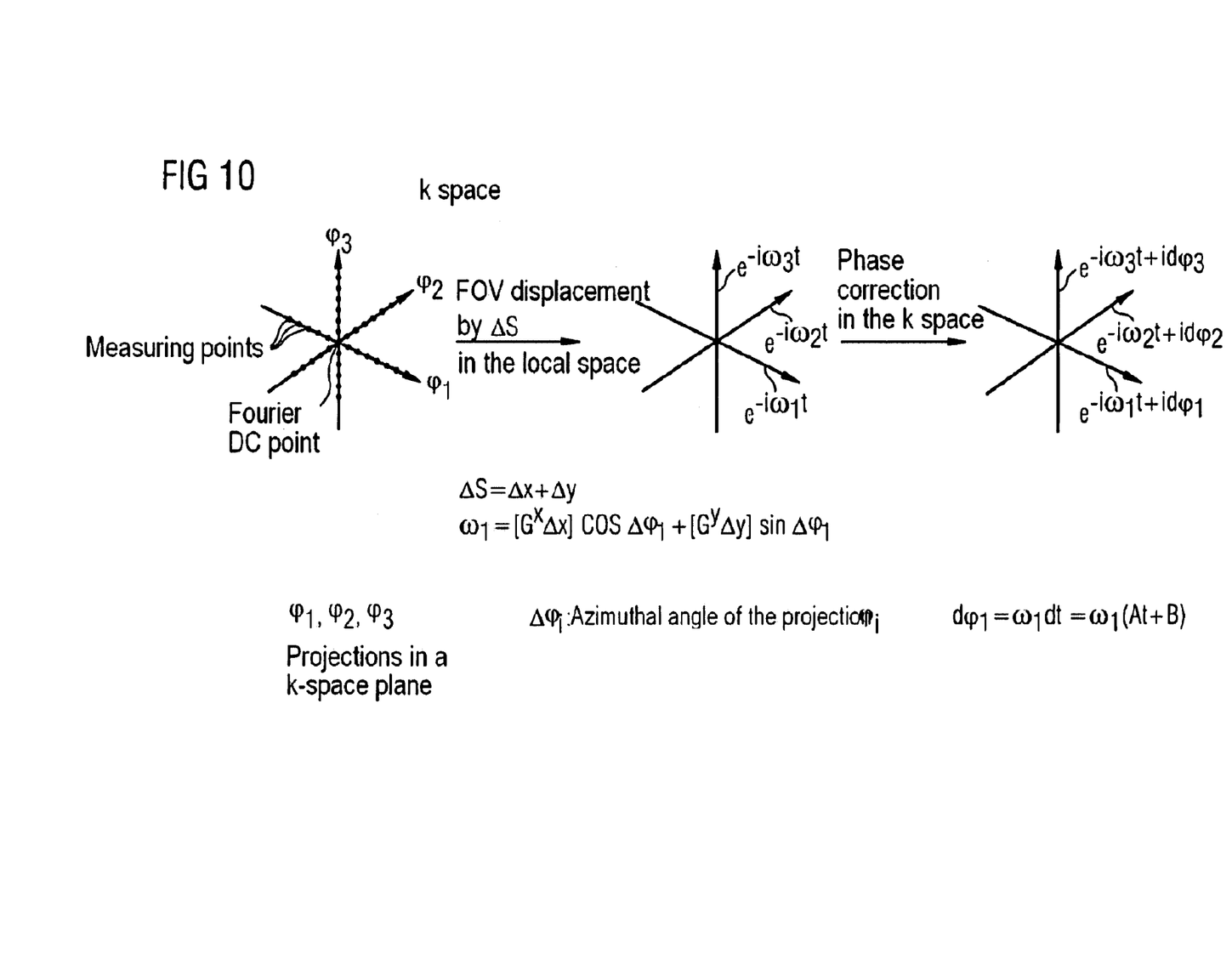
FIG. 10 shows the FOV displacement and phase correction using the measuring points or, as the case may be, the trajectory in the k space.

In order, therefore, to achieve an inplane displacement of the FOV by $\Delta S = \Delta x + \Delta y$, reference signals $e^{i\omega_i t}$ are superimposed on the projections $\phi_i$, where $$\omega_i = \gamma_H[G^x \Delta x] \cos \Delta\omega_i + \gamma_H[G^y \Delta y] \sin \Delta\phi_i,$$

where $\gamma_H$ is the gyromagnetic ratio for hydrogen nuclei, $G^x$ is the gradient amplitude of the gradient in the x direction, and $G^y$ is the gradient amplitude of the gradient in the y direction. $\Delta x$ is the inplane displacement component of $\Delta S$ in the x direction and $\Delta y$ is the inplane displacement component of $\Delta S$ in the y direction (see FIG. 9). The respective combination of $G^x$ and $G^y$ forms the rotating read-out gradient that implements radial read-out in the respective read-out direction and is generally referred to as G.

Figure 5:
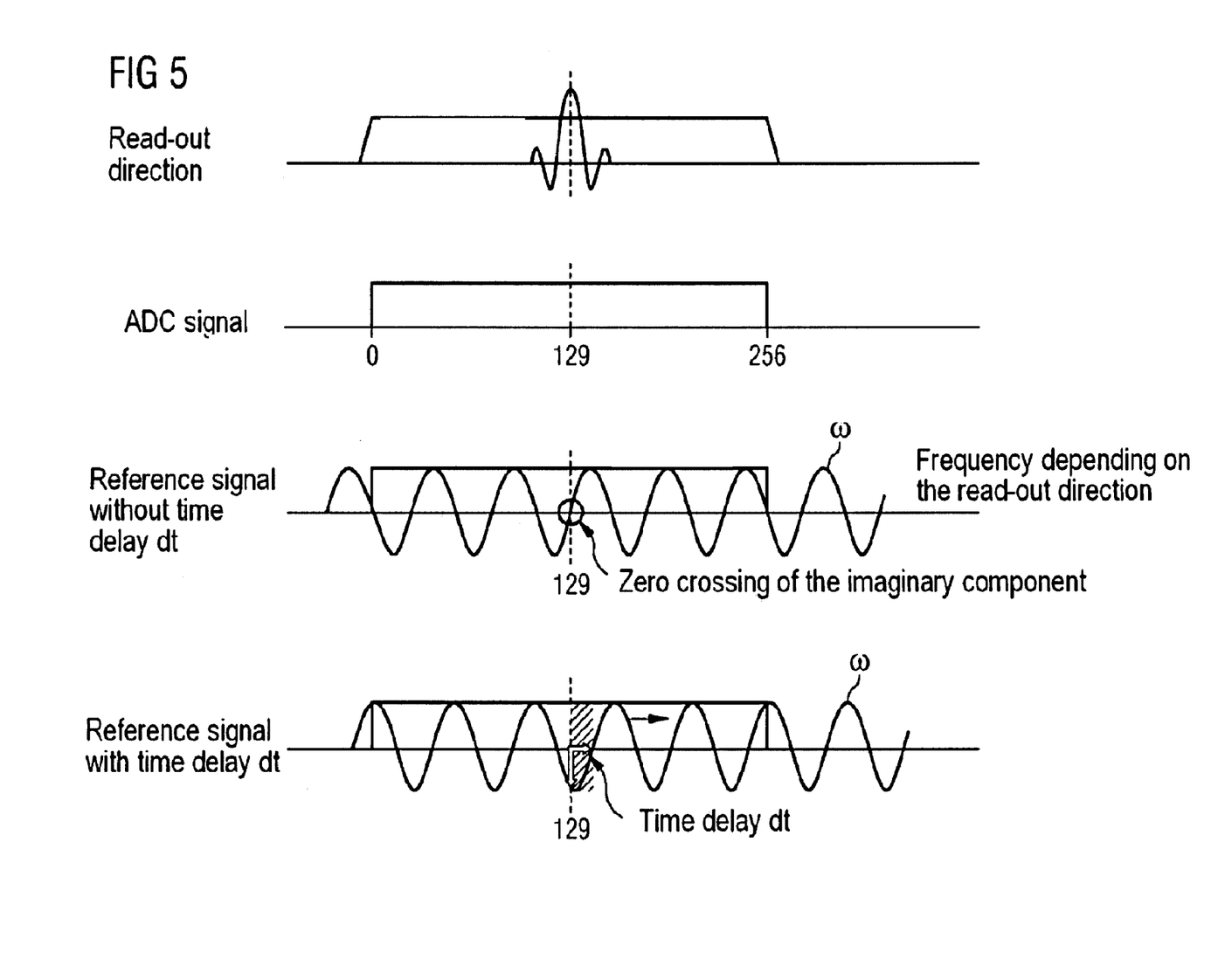
FIG. 5 shows important sections of a sequence scheme with a beamed-in reference signal.

FIG. 5 shows the sequence (gradient or spin-echo sequence) section that results in reading out of a projection modulated by a complex reference signal and supplies some of the data for the displaced FOV. The complete k-space data set is only obtained from the measuring points of all modulated projections that produce the displaced FOV following Fourier transformation.

FIG. 5 further shows the imaginary components of two complex reference signals that have the same modulation frequency $\omega$ and have been superimposed differently on the ADC signal. The first reference signal is characterized by a zero crossing at the measuring point 129, which in this case (256-pixel resolution) represents the mid point of this projection. The mid point of a projection in the case of radial k-space scanning in general is the measuring point whose complex value is transformed by image-generating Fourier transformation into a non-oscillating zero-frequency component (referred to as the direct-current component). It is owing to this characteristic that this specially distinguished point is referred to below as the "Fourier DC point". Said Fourier DC point can then be used to determine the phase of a reference signal (or, as the case may be, its real or imaginary component) relative to the ADC signal.

That is because of the problem that, due to hardware-based imperfections, differences in propagation time occur between the ADC signal and reference signal which, owing to the reference signal frequency's projection-dependency (dependency on the read-out direction), equally superimpose a generally different phase on the measuring data of the respective projections (the different phases can be measured in the Fourier DC points of the respective projections). These phase differences cause the measured values of the individual projections to differ with respect to phase and so no longer to be correctly comparable. A Fourier transformation of the projection data will then produce a distorted, blurred image as shown by means of a phantom, for example, in FIG. 3B and FIG. 8. The second reference signal in FIG. 5 exhibits a phase-engendering temporal displacement of said type between the reference signal and ADC signal which displacement is referred to below as the time delay dt. The time delay dt thus results as a function of the frequency $\omega_i$ of the respective reference signal in projection-specific phase errors: $d\phi_i = \omega_i \, dt$. The time delay dt itself is, as has been shown experimentally, independent of the read-out direction, but is device-specifically dependent on measurement parameters requiring to be set.

The aim of the present invention is to provide a measuring and correction method and a device enabling the phase error $d\phi_i$ of the respective projection $\phi_i$ to be compensated or, as the case may be, corrected during or, as the case may be, after measuring but before Fourier transformation.

The inventive measuring and correction method is preceded by an inventive calibrating method by means of which device-dependent influencing of the time delay dt by measurement parameters is determined. The calibrating method determines a mathematical correlation between relevant measurement parameters and the time delay dt. The projection-dependent error phase $d\phi_i$ can then be determined from dt if information is available relating to FOV displacement (known $\Delta S$):

$$d\phi_i = \omega_i dt = G_i \Delta S\, dt$$

Phase correction can then be effected in two ways:

Measuring method:

The phase of the reference signal relative to the ADC signal is displaced by $-d\phi_i$ prior to data acquisition for a projection $\phi_i$, and the time delay $$dt = \frac{d\varphi_i}{\omega_i}$$

thereby compensated even before measuring takes place.

Correction method:

There is projection-by-projection data acquisition with superimposing of a projection-specific reference signal and no correcting. After measuring, but before image reconstruction through Fourier transformation, each projection is phase-corrected element by element by multiplying the respective projection data set $\phi_i$ by the projection-specific correction factor $e^{-id\phi_i} = e^{-i\omega_i dt}$.

Owing to the preceding calibrating method the dt (in both cases) no longer has to be measured experimentally but can be deduced in advance purely computationally from the measurement parameter device configuration with the aid of the mathematical correlation.

The inventive calibrating method is explained in more detail below (FIGS. 6, 7, and 9):

What will be considered is the effect of a selection of measurement parameters on the phase in the Fourier DC point for different inplane FOV displacements ($\Delta S$), and hence indirectly on the time delay dt, which, as already mentioned, is independent of the read-out direction.

Figure 6:
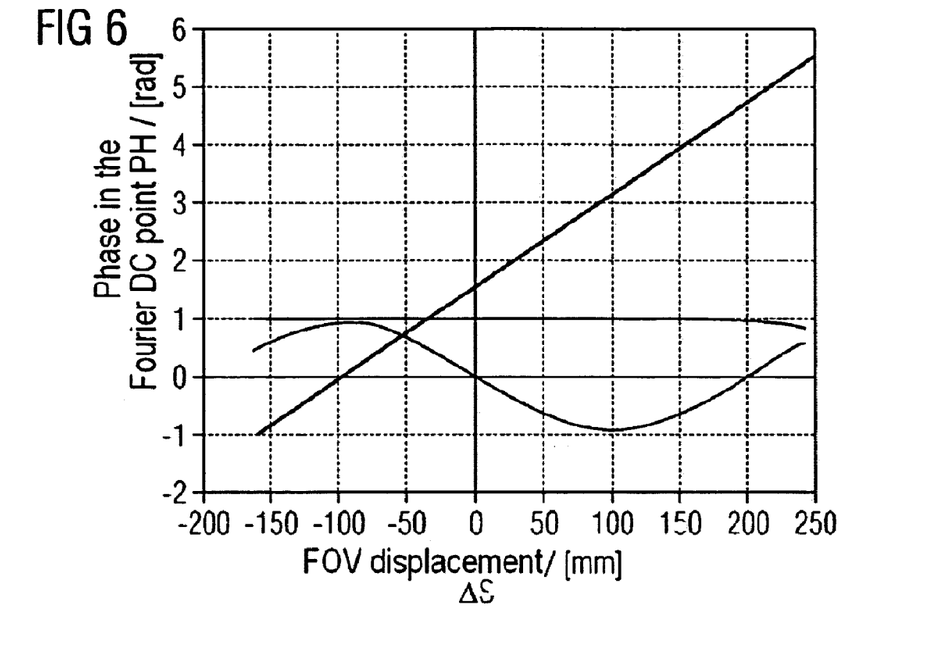
FIG. 6 shows in the chart the dependency of the phase in the Fourier DC point on the FOV displacement in the same read-out direction.

The phase PH in the Fourier DC point is for this purpose always measured in the same read-out direction, but with varying FOV displacement in this direction ($\Delta S$), using a homogeneously signal-transmitting (homogeneity intense) phantom, and plotted on the chart (FIG. 6). Owing to the linear correlation between the displacement $\Delta S$ and the phase PH, at least two such measurements produce a straight line whose slope corresponds to the time delay dt. In order to ascertain a measurement-parameter dependency of the time delay dt, the PH-$\Delta S$ dependency (FIG. 6) is measured for different variations within the measurement parameters such as, for example, a variation in the size of the FOV [mm], resolution [number of pixels per projection], bandwidth [Hz/pixel], sequence type, scanner type, and layer orientation etc.

For current PH-$\Delta S$ measurement series it has been shown that only the scanning rate $t_{os}$ [sec] has a noticeable impact on the time delay dt that can be expressed by the following mathematical correlation $$dt = A\, t_{os} + B$$

$t_{os}$ is therein characterized by indirect proportionality to the product of bandwidth and resolution.

$$t_{os} \sim \frac{1}{\text{Bandwidth} \cdot \text{Resolution}}$$

Figure 7:
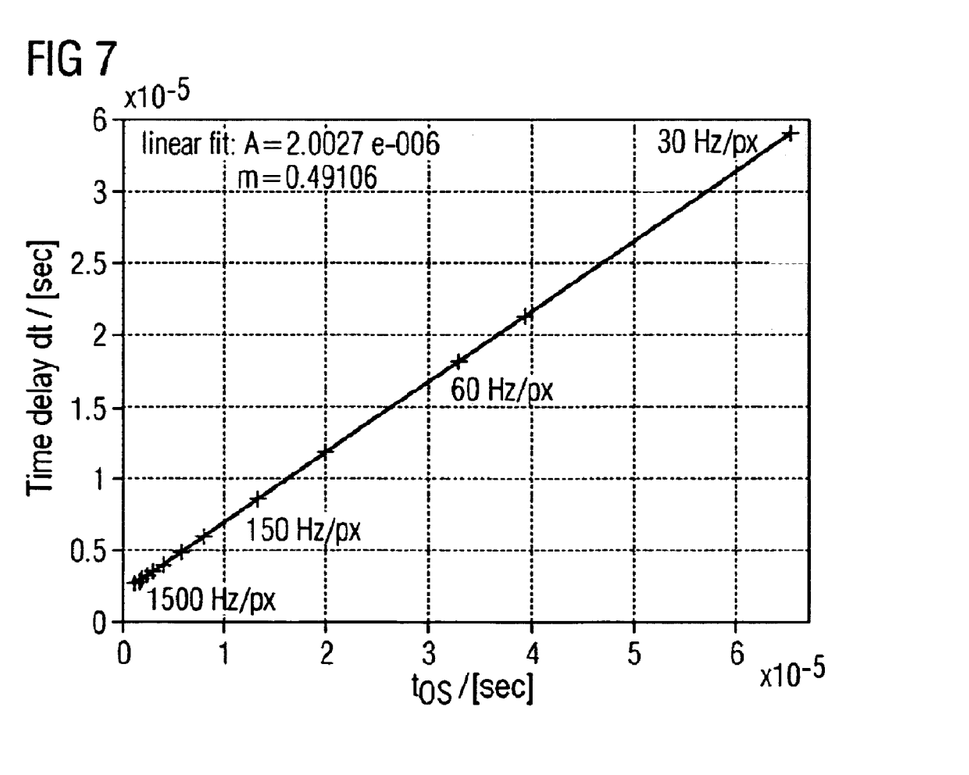
FIG. 7 shows in the chart the dependency of the time delay on the scanning rate tos.

This linearity is shown in FIG. 7 using a variation of the bandwidth (30 Hz/pixel to 1,500 Hz/pixel). For the device type surveyed in FIG. 7, for example, the coefficients were produced as being $$A = 0.495 \pm 0.011$$

and $B = 1.97 \pm 0.05$ µs.

Summarizing, the above-explained calibrating method allows the time delay dt to be determined on the basis of set measurement parameters (currently the scanning rate) for a specific device type.

From the thus determined time delay dt, FOV displacement information $\Delta S$, amplitude of the read-out gradient, and azimuthal angle $\Delta\phi_i$ of the respective projection $\phi_i$ it is possible to determine the respective phase error $d\phi_i$ of all projections involved in overall measuring and to take it into account and compensate it either during measuring (measuring method A)) or correct it computationally after measuring (correction method B)).

Figure 8:
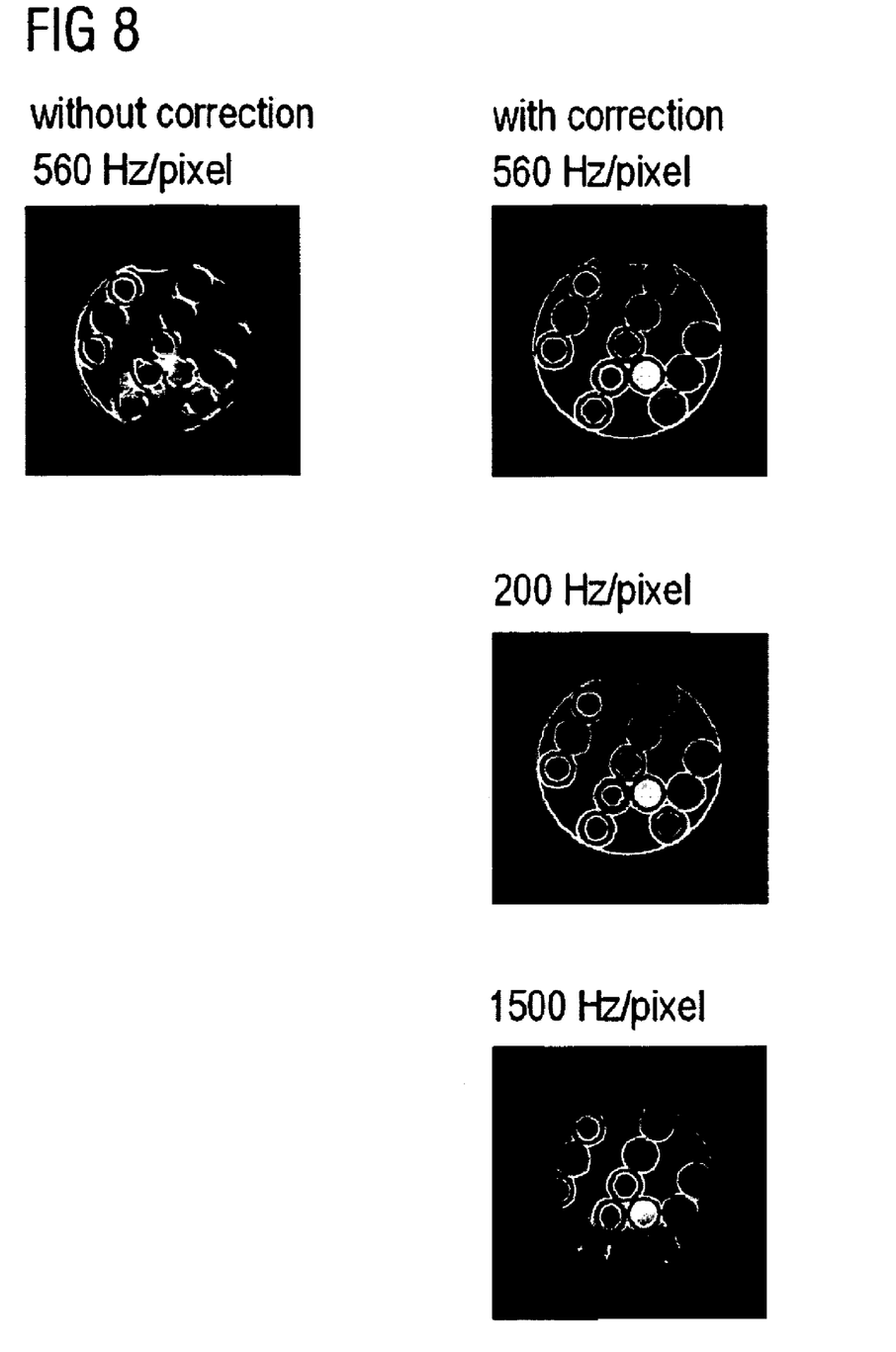
FIG. 8 shows, using a phantom, the result of phase correcting for different bandwidths.

The result of correction of said type is shown in the right-hand column in FIG. 8, with measuring having taken place at different bandwidths (560 Hz/pixel, 200 Hz/pixel, 1,500 Hz/pixel). Shown in the left-hand column is an image exhibiting intense image artifacts (distortions, smudging). This is due ultimately to the very fact that a different error phase $d\phi_i$ has been superimposed on each projection $\phi_i$. In the inventive method (A) the phases of the reference signals compared to the ADC signal are in each case selected in such a way that the phase in the Fourier DC point of the respective projections is independent of the frequency of the reference signal, hence being, for example, zero.

It is to be noted that the phase PH of the Fourier DC point, a projection $\phi_i$ after an FOV displacement by a distance $\Delta S$ (which displacement ultimately results in the chart in FIG. 6), is advantageously determined by averaging the complex values of all measuring points of the respective projection $\phi_i$. In the case of a homogeneously signal-transmitting phantom it is further advantageous to determine the phase of the average of the Fourier-transformed measuring points weighted with their magnitude square in the read-out direction.

It is further to be noted that the FOV displacement can theoretically (on a digital level) also be implemented by multiplying the respective reference signal onto the respective already measured projection data set (as is customary, for example, in spiral imaging). That would, though, violate the Nyquist condition in the case of fast imaging sequences in the boundary area of the projection data set and lead to intense folding. FOV displacement must for that reason be performed analogously by superimposing the reference signal on the high-frequency scanning signal (approximately 16,000 points at approximately 10 MHz) physically isochronously, as a result of which a large spectral width can be obtained. Of sole interest from among these approximately 16,000 points is the point range imaging the FOV in such a way that during ADC scanning of, for example, 256 scanning values (FIG. 5) the Nyquist condition in the boundary area of the FOV is just met, which is to say the occurrence of further folding is just avoided. Superimposing of the reference signal on the scanning signal takes place in an analog mixer enabling phase selection for both signals (precisely the phase correction or, as the case may be, phase compensation according to the invention) relative to each other.

The invention claimed is:

1. A calibrating method for determining a device-specific time delay dt between a reference signal and a measuring data point in a read-out direction when having a FOV displacement within a plane in MRT imaging, comprising:
    specifying the read-out direction;
    measuring a plurality of phase values in a Fourier DC point for different FOV displacements in the read-out direction;
    determining the device-specific time delay as a slope of a linear function between the FOV displacements and the phase values; and
    repeating the measuring and determining steps for a variation of a measurement parameter until a mathematical correlation is determined between the device-specific time delay and the measurement parameter.

2. The calibrating method as claimed in claim 1, wherein the measurement parameter is selected from the group consisting: size of the FOV, resolution, bandwidth, sequence type, scanner type, layer orientation, and scanning rate t of radial frequency space scanning.

3. The calibrating method as claimed in claim 2, wherein the measurement parameter is the scanning rate t of radial frequency space scanning which has the largest impact on the time delay.

4. The calibrating method as claimed in claim 1, wherein the mathematical correlation is dt=A·t+B, where t is indirectly proportional to a product of bandwidth and resolution.

5. The calibrating method as claimed in claim 1, wherein measuring the phase values in the Fourier DC point is based on averaging complex values of Fourier-transformed measuring points of the read-out direction.

6. The calibrating method as claimed in claim 1, wherein the Fourier-transformed measuring points in the read-out direction are weighted with their magnitude square during averaging.

7. The calibrating method as claimed in claim 1, wherein the measuring is performed on a homogeneously signal-transmitting phantom contained within the FOV.

8. A measuring method for artifact-reduced MRT imaging when having a FOV displacement, comprising:
    generating high-frequency exciting pulses;
    radially scanning a signal in a frequency space by gradient pulses using an analog-to-digital converter;
    superimposing a reference signal on the radially scanned signal of a read-out direction,
        wherein a frequency of the reference signal is dependent on the read-out direction,
        wherein a phase of the reference signal relative to the radially scanned signal is calibrated so that a phase in a Fourier DC point of the read-out direction is independent of the frequency of the reference signal; and
    performing a Fourier transformation on the radially scanned signal to obtain an artifact-reduced image in a local space.

9. A correction method for artifact-reduced MRT imaging when having a FOV displacement, comprising:
    generating high-frequency exciting pulses;
    radially scanned signal in a frequency space by gradient pulses using an analog-to-digital converter;
    superimposing a reference signal on the radially scanned signal of a read-out direction,
        wherein a frequency of the reference signal is dependent on the read-out direction;
    determining a read-out direction specific error phase $d\phi_i$ due to a time delay between the radially scanned signal and the reference signal;
    correcting a phase of the radially scanned signal by multiplying a phase-correction factor $\exp(-id\phi_i)$ in the read-out direction; and
    performing a Fourier transformation on the phase-corrected radially scanned signal to obtain an artifact-reduced image in a local space.

* * * * *